US010943780B2

(12) United States Patent
Bhuyan et al.

(10) Patent No.: US 10,943,780 B2
(45) Date of Patent: Mar. 9, 2021

(54) METHODS FOR ALD OF METAL OXIDES ON METAL SURFACES

(71) Applicant: Applied Materials, Inc., Santa Clara, CA (US)

(72) Inventors: Bhaskar Jyoti Bhuyan, San Jose, CA (US); Mark Saly, Santa Clara, CA (US); David Thompson, San Jose, CA (US); Li-Qun Xia, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/195,168

(22) Filed: Nov. 19, 2018

(65) Prior Publication Data

US 2019/0157067 A1 May 23, 2019

Related U.S. Application Data

(60) Provisional application No. 62/588,422, filed on Nov. 19, 2017.

(51) Int. Cl.
*H01L 21/02* (2006.01)
*C23C 16/455* (2006.01)
*C23C 16/02* (2006.01)
*C23C 16/40* (2006.01)

(52) U.S. Cl.
CPC ...... *H01L 21/0228* (2013.01); *C23C 16/0227* (2013.01); *C23C 16/40* (2013.01); *C23C 16/45553* (2013.01); *H01L 21/02172* (2013.01); *H01L 21/02178* (2013.01); *H01L 21/0206* (2013.01)

(58) Field of Classification Search
None
See application file for complete search history.

(56) References Cited

U.S. PATENT DOCUMENTS

| 4,971,620 | A | 11/1990 | Jikihara et al. |
| 6,426,307 | B2 | 7/2002 | Lim |
| 6,566,276 | B2 | 5/2003 | Maloney et al. |
| 6,713,373 | B1 * | 3/2004 | Omstead ........... H01L 21/76843 257/E21.17 |
| 6,926,572 | B2 | 8/2005 | Park et al. |
| 6,936,683 | B1 | 8/2005 | Vanderzande et al. |
| 7,135,207 | B2 | 11/2006 | Min et al. |
| 8,741,698 | B2 | 6/2014 | Tong et al. |
| 9,859,153 | B1 | 1/2018 | Rainville et al. |
| 2001/0056174 | A1 | 12/2001 | Okada et al. |
| 2002/0013487 | A1 | 1/2002 | Norman et al. |
| 2002/0145168 | A1 | 10/2002 | Bojarkczuk et al. |
| 2003/0051324 | A1 | 3/2003 | Inomata |
| 2003/0064153 | A1 | 4/2003 | Solanki et al. |
| 2003/0082296 | A1 * | 5/2003 | Elers ................. H01L 21/28568 174/256 |
| 2004/0043630 | A1 | 3/2004 | Vaartstra et al. |
| 2004/1005805 | | 3/2004 | Linford et al. |
| 2004/1009209 | | 5/2004 | Raaijmakers et al. |
| 2004/0127426 | A1 | 7/2004 | Graupe et al. |
| 2004/0253532 | A1 | 12/2004 | Wu et al. |
| 2005/0084610 | A1 | 4/2005 | Selitser |
| 2005/0181555 | A1 | 5/2005 | Haukka et al. |
| 2005/0003662 | A1 | 6/2005 | Jursich et al. |
| 2005/0223987 | A1 | 10/2005 | Iwata et al. |
| 2006/0172485 | A1 | 8/2006 | Vaartstra |
| 2006/0199399 | A1 | 9/2006 | Muscat |
| 2007/1000420 | | 1/2007 | Fukazawa et al. |
| 2008/0032444 | A1 | 2/2008 | Wu et al. |
| 2008/0085610 | A1 | 4/2008 | Wang et al. |
| 2008/0125342 | A1 | 5/2008 | Visintin et al. |
| 2008/0292800 | A1 | 11/2008 | Murayama et al. |
| 2009/0136658 | A1 | 5/2009 | Yoshinaka et al. |
| 2010/0301478 | A1 | 12/2010 | Waechtler et al. |
| 2012/0070981 | A1 * | 3/2012 | Clendenning ..... H01L 21/76873 438/653 |
| 2013/0078819 | A1 | 3/2013 | Sun et al. |
| 2014/0057453 | A1 | 2/2014 | Madocks et al. |
| 2015/0299848 | A1 | 10/2015 | Haukka et al. |
| 2016/0145738 | A1 * | 5/2016 | Liu .......................... C23C 16/18 427/251 |
| 2018/0010247 | A1 | 1/2018 | Niskanen et al. |

FOREIGN PATENT DOCUMENTS

WO    2014210328  A1    12/2014

OTHER PUBLICATIONS

PCT International Search Report and Written Opinion in PCT/US2018/061757, dated Feb. 28, 2019, 13 pages.
PCT International Search Report and Written Opinion in PCT/US2015/056876, dated Dec. 23, 2015, 14 pages.
Cheng, Cheng-Wei , et al., "In situ metal-organic chemical vapor deposition atomic-layer deposition of aluminum oxide on GaAs using trimethyaluminum and isopropanol precursors", American Institute of Physics, Jul. 21, 2008, 1-3.
Jeon, Woo-Seok , et al., "Atomic Layer Deposition of Al2O3 Thin Films Using Trimethylaluminum and Isopropyl Alcohol", Journal of the Electrochemical Society, 2002, C306-C310.
Kobayashi, Nobuhiko P., et al., "Two-Stage Atomic Layer Deposition of Aluminum Oxide on Alkanethiolate Self-Assembled Monolayers Using n-Propanol and Water as Oxygen Sources", American Chemical Society, Jul. 30, 2008, 5356-5360.
Solanki, Raj , et al., "Atomic Layer Deposition of Copper Seed Layers", The Electrochemical Society, Jun. 30, 2000, 479-480.
Yanguas-Gil, Angel , et al., "Growth rate control in ALD by surface functionalization: alkyl alcohols on metal oxides", The Electrochemical Society, 2010, 1-10.

(Continued)

*Primary Examiner* — Ali Naraghi
(74) *Attorney, Agent, or Firm* — Servilla Whitney LLC

(57) ABSTRACT

Methods for depositing metal oxide layers on metal surfaces are described. The methods include exposing a substrate to separate doses of a metal precursor, which does not contain metal-oxygen bonds, and an alcohol. These methods do not oxidize the underlying metal layer.

20 Claims, No Drawings

(56) References Cited

OTHER PUBLICATIONS

Written Opinion of the International Searching Authority in PCT/US2019/025975, dated Jul. 23, 2019, 11 pages.
Non-Final Office Action in U.S. Appl. No. 16/376,176, dated Sep. 11, 2020, 9 pages.
Non-Final Office Action in U.S. Appl. No. 16/739,992, dated Sep. 11, 2020, 13 pages.

* cited by examiner

METHODS FOR ALD OF METAL OXIDES ON METAL SURFACES

CROSS-REFERENCE TO RELATED APPLICATIONS

This application claims priority to U.S. Provisional Application No. 62/588,422, filed Nov. 19, 2017, the entire disclosure of which is hereby incorporated by reference herein.

TECHNICAL FIELD

Embodiments of the disclosure relate to methods of depositing thin films. In particular, the disclosure relates to methods for depositing metal oxides on metal surfaces without interfacial oxidation.

BACKGROUND

Thin films are widely used in semiconductor manufacturing for many processes. For example, thin films of metal oxides (e.g., aluminum oxide) are often used in patterning processes as spacer materials and etch stop layers. These materials allow for smaller device dimensions without employing more expensive EUV lithography technologies.

Common techniques for depositing metal oxides on substrate surfaces often involve oxidizing a portion of the substrate surface. The oxidation process, especially on metal surfaces, can be detrimental to device performance.

Therefore, there is a need in the art for methods of depositing metal oxides on metal surfaces without oxidizing the metal surface.

SUMMARY

One or more embodiments of the disclosure are directed to deposition methods. The methods comprise providing a substrate with a first metal surface. The first metal comprises one or more of cobalt, copper, nickel, ruthenium, tungsten, or platinum. The substrate is exposed separately to a second metal precursor and an alcohol to form a second metal oxide layer on the first metal surface. The second metal comprises one or more of aluminum, hafnium, zirconium, nickel, zinc, tantalum or titanium, and the second metal precursor comprises substantially no metal-oxygen bonds. The methods produce substantially no oxidation of the first metal surface.

Additional embodiments of the disclosure are directed to deposition methods. The methods comprise providing a substrate with a first metal surface. The first metal consists essentially of cobalt. The substrate is exposed to a second metal precursor and an alcohol separately to form a second metal oxide layer on the first metal surface. The second metal precursor consists essentially of trimethyl aluminum (TMA) and the alcohol consists essentially of isopropyl alcohol (IPA). The methods produce substantially no oxidation of the first metal surface.

Further embodiments of the disclosure are directed to deposition methods. The methods comprise providing a substrate with a first metal surface. The first metal consists essentially of cobalt. The substrate is exposed to a hydrogen plasma. The substrate is exposed to a second metal precursor and an alcohol separately to form a second metal oxide layer on the first metal surface. The second metal precursor consists essentially of trimethyl aluminum (TMA) and the alcohol consists essentially of isopropyl alcohol (IPA). The substrate is maintained at a temperature of about 350° C. and the methods produce substantially no oxidation of the first metal surface.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure provide methods to deposit metal oxide layers onto metal surfaces with substantially no oxidation of the metal surface. As used in this regard, "substantially no oxidation" means that the surface contains less than 5%, 2%, 1% or 0.5% of oxygen based on a count of surface atoms. Without being bound by theory, oxidation of the metal surface may increase resistivity of the underlying metal material and lead to an increased at a rate of device failure. Embodiments of this disclosure advantageously provide for the deposition of a second metal oxide layer without oxidation of the first metal surface.

For example, a method to deposit aluminum oxide on cobalt which utilizes trimethyl aluminum and water produces significant amounts of cobalt oxide between the cobalt layer and the aluminum oxide layer. In contrast, the disclosed methods deposit a similar aluminum oxide layer without producing a cobalt oxide layer between the cobalt layer and aluminum oxide layer.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

According to one or more embodiments, the method uses an atomic layer deposition (ALD) process. In such embodiments, the substrate surface is exposed to the precursors (or reactive gases) separately or substantially separately. As used herein, "separately" means that the metal precursor and the alcohol are separated temporally, spatially or both. As used herein throughout the specification, "substantially separately", as it relates to temporal separation, means that a majority of the duration of a precursor exposure does not overlap with the exposure to a co-reactant, although there may be some overlap. As used herein throughout the specification, "substantially separately", as it relates to spatial separation, means that a majority of the exposure area of a precursor exposure does not overlap with the exposure area of a co-reactant, although there may be some overlap.

As used in this specification and the appended claims, the terms "precursor", "reactant", "reactive gas" and the like are used interchangeably to refer to any gaseous species that can react with the substrate surface, or a species present on the substrate surface.

In one or more embodiments, the method is performed using an Atomic Layer Deposition (ALD) process. An ALD process is a self-limiting process where a single layer of material is deposited using a binary (or higher order) reaction. An individual ALD reaction is theoretically self-limiting continuing until all available active sites on the substrate surface have been reacted. ALD processes can be performed by time-domain or spatial ALD.

In a time-domain process, the processing chamber and substrate are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial ALD process, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

In some embodiments, a substrate containing a first metal layer has a first metal surface. The first metal may be any suitable metal. Ideally, the first metal surface consists essentially of the first metal. In practice, the first metal surface may additionally comprise contaminants or other films on its surface which comprise elements other than the first metal.

In some embodiments, the first metal comprises one or more of cobalt, copper, nickel, ruthenium, tungsten, or platinum. In some embodiments, the first metal is a pure metal comprises a single metal species. In some embodiments, the first metal is a metal alloy and comprises multiple metal species. In some embodiments, the first metal consists essentially of cobalt, copper, nickel, ruthenium, tungsten, or platinum. In some embodiments, the first metal consists essentially of cobalt. In some embodiments, the first metal consists essentially of copper. As used in this regard, "consists essentially of" means that the stated material is greater than or equal to about 95%, 98%, 99% or 99.5% of the stated species.

The substrate is provided for processing by the disclosed methods. As used in this regard, the term "provided" means that the substrate is placed into a position or environment for further processing. The substrate is exposed to a second metal precursor and an alcohol to form a second metal oxide layer on the first metal surface. In some embodiments, the substrate is exposed to the second metal precursor and the alcohol separately.

The second metal precursor comprises a second metal and one or more ligands. The second metal may be any suitable metal from which a metal oxide may be formed. In some embodiments, the second metal comprises one or more of aluminum, hafnium, zirconium, nickel, zinc, tantalum or titanium. In some embodiments, the second metal consists essentially of aluminum, hafnium, zirconium, nickel, zinc, tantalum or titanium. In some embodiments, the second metal consists essentially of aluminum.

A ligand of the second metal precursor may be any suitable ligand. In some embodiments, the second metal precursor contains substantially no metal-oxygen bonds. As used in this regard, "contains substantially no metal-oxygen bonds" means that the second metal precursor has metal-ligand bonds which contain fewer than 2%, 1% or 0.5% of metal-oxygen bonds as measured by total metal-ligand bond count. As used in this disclosure, a description of a ligand is primarily made by the element which attaches to the metal center of the second metal precursor. Accordingly, a carbo ligand would exhibit a metal-carbon bond; an amino ligand would exhibit a metal-nitrogen bond; and a halide ligand would exhibit a metal-halogen bond.

In some embodiments, the second metal precursor comprises at least one carbo ligand. In some embodiments, the second metal precursor comprises only carbo ligands. In embodiments where at least one carbo ligand is present, each carbo ligand independently contains from 1 to 6 carbon atoms. In some embodiments, the carbo ligand is methyl. In some embodiments, the carbo ligand is ethyl. In some embodiments where the second metal precursor comprises at least one carbo ligand, the disclosed methods provide a second metal oxide layer which contains substantially no carbon.

In some embodiments, the second metal precursor consists essentially of trimethyl aluminum (TMA). In some embodiments, the second metal precursor consists essentially of triethyl aluminum (TEA).

In some embodiments, the second metal precursor comprises at least one amino ligand. In some embodiments, the second metal precursor comprises only amino ligands. In some embodiments, the second metal precursor comprises at least one halide ligand. In some embodiments, the second metal precursor comprises only halide ligands.

The alcohol is of the general formula R—OH, where R is any suitable organic substituent. In some embodiments, the alcohol contains 1, 2, 3, 4, 5, 6, 7, 8, 9, or 10 carbon atoms. In some embodiments, the organic substituent is one or more of alkyl, alkenyl, alkynyl, cyclo, aryl, linear or branched. In some embodiments, the organic substituent contains atoms other than carbon. In some embodiments, the alcohol contains more than one hydroxyl group. In some embodiments, the alcohol consists essentially of methanol. In some embodiments, the alcohol consists essentially of ethanol. In some embodiments, the alcohol consists essentially of isopropanol. In some embodiments, the alcohol consists essentially of t-butanol. As used in this regard, an alcohol "consists essentially of" a stated alcohol if the alcohol is greater than 95%, 98%, 99% or 99.5% of the stated alcohol on a molar basis.

While a substrate is processed according to embodiments of this disclosure, several conditions may be controlled. These conditions include, but are not limited to substrate temperature, flow rate, pulse duration and/or temperature of the second metal precursor and/or the alcohol, and chamber pressure The temperature of the substrate during deposition can be any suitable temperature depending on, for example, the precursor(s) being used. During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

In some embodiments, the substrate is maintained at a temperature greater than or equal to about 25° C., or about 50° C., or about 100° C., or about 150° C., or about 200° C., or about 250° C., or about 300° C., or about 350° C., or about 400° C., or about 450° C., or about 500° C. In some embodiments, the substrate temperature is maintained at a temperature less than or equal to about 600° C., or about 550° C., or about 500° C., or about 450° C., or about 400° C., or about 350° C., or about 300° C., or about 250° C., or about 200° C., or about 150° C., or about 100° C., or about 50° C., or about 25° C. In some embodiments, the substrate temperature is maintained at a temperature of about 350° C.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The reactants (e.g., the second metal precursor and the alcohol) may be provided in one or more pulses or continuously. The flow rate of the reactants can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The reactants can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to each reactant may be any suitable amount of time necessary to allow the reactant to form an adequate nucleation layer atop the substrate surface. For example, the reactants may be flowed into the process chamber for a period of about 0.1 seconds to about 90 seconds. In some time-domain ALD processes, the reactants are exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the reactants. The inert gas may be mixed with the reactant (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the reactants are mixed with argon prior to flowing into the process chamber.

In addition to the foregoing, additional process parameters may be regulated while exposing the substrate to the reactants. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

In some embodiments, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the reactants. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the second metal precursor, described above, or in some embodiments, the flow rate may be increased or decreased. For example, in some embodiments, the inert gas may be provided to the process chamber at a flow rate of about 0 to about 10000 sccm to purge the process chamber. In spatial ALD, purge gas curtains are maintained between the flows of reactants and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases.

While the generic embodiment of the processing method described herein includes only two pulses of reactive gases, it will be understood that this is merely exemplary and that additional pulses of reactive gases may be used.

The processing chamber pressure during deposition can be in the range of about 50 mTorr to 750 Torr, or in the range of about 100 mTorr to about 400 Torr, or in the range of about 1 Torr to about 100 Torr, or in the range of about 2 Torr to about 10 Torr The second metal oxide layer formed can be any suitable film. In some embodiments, the film formed is an amorphous or crystalline film comprising one or more species according to $MO_x$, where the formula is representative of the atomic composition, not stoichiometric. In some embodiments, the second metal oxide is stoichiometric. In some embodiments, the second metal film has a ratio of second metal to oxygen which is greater than the stoichiometric ratio. In some embodiments, the second metal oxide is stoichiometric. In some embodiments, the second metal film has a ratio of second metal to oxygen which is less than the stoichiometric ratio.

Upon completion of deposition of the second metal oxide layer to a desired thickness, the method generally ends and the substrate can proceed for any further processing.

In some embodiments, the substrate is cleaned before exposing the substrate to form the second metal oxide layer. In some embodiments, cleaning the substrate comprises exposing the substrate to a hydrogen plasma. As used in this manner, the term "hydrogen plasma" refers to a plasma with molecular hydrogen (i.e., $H_2$). In some embodiments, the hydrogen plasma is greater than or equal to about 50%, 60%, 70%, 80%, 90%, 95%, 98% or 99% $H_2$ on a molar basis.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be taken to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A deposition method comprising:
   providing a substrate with a first metal surface, the first metal comprising one or more of cobalt, copper, nickel, ruthenium, tungsten, or platinum; and
   exposing the substrate separately to a second metal precursor and an alcohol to form a second metal oxide layer on the first metal surface, the second metal comprising one or more of aluminum, hafnium, zirconium, nickel, zinc, tantalum or titanium, the second metal precursor comprising substantially no metal-oxygen bonds,
   wherein the method produces substantially no oxidation of the first metal surface.

2. The method of claim 1, further comprising cleaning the substrate before exposing the substrate to form the second metal oxide layer.

3. The method of claim 2, wherein cleaning the substrate comprises exposing the substrate to a hydrogen plasma.

4. The method of claim 1, wherein the first metal consists essentially of cobalt.

5. The method of claim 1, wherein the first metal consists essentially of copper.

6. The method of claim 1, wherein the second metal consists essentially of aluminum.

7. The method of claim 1, wherein the second metal precursor comprises at least one carbo ligand.

8. The method of claim 7, wherein the at least one carbo ligand contains 1 to 6 carbon atoms.

9. The method of claim 8, wherein the carbo ligand is methyl.

10. The method of claim 8, wherein the carbo ligand is ethyl.

11. The method of claim 7, wherein the second metal precursor comprises only carbo ligands.

12. The method of claim 7, wherein the second metal oxide layer contains substantially no carbon.

13. The method of claim 1, wherein the second metal precursor comprises at least one amino ligand.

14. The method of claim 1, wherein the second metal precursor comprises at least one halide ligand.

15. The method of claim 1, wherein the alcohol contains 1 to 10 carbon atoms.

16. The method of claim 15, wherein the alcohol consists essentially of isopropyl alcohol.

17. The method of claim 15, wherein the alcohol consists essentially of methanol or ethanol.

18. A deposition method comprising:
providing a substrate with a first metal surface, the first metal consisting essentially of cobalt; and
exposing the substrate separately to a second metal precursor and an alcohol to form a second metal oxide layer on the first metal surface, the second metal precursor consisting essentially of trimethyl aluminum and the alcohol consisting essentially of isopropyl alcohol,
wherein the method produces substantially no oxidation of the first metal surface.

19. The method of claim 18, wherein the substrate is maintained at a temperature greater than or equal to about 100° C.

20. A deposition method comprising:
providing a substrate with a first metal surface, the first metal consisting essentially of cobalt;
exposing the substrate to a hydrogen plasma; and
exposing the substrate separately to a second metal precursor and an alcohol to form a second metal oxide layer on the first metal surface, the second metal precursor consisting essentially of trimethyl aluminum and the alcohol consisting essentially of isopropyl alcohol,
wherein the substrate is maintained at a temperature of about 350° C. and the method produces substantially no oxidation of the first metal surface.

* * * * *